(12) United States Patent  
Maruyama et al.

(10) Patent No.: US 8,790,461 B2  
(45) Date of Patent: Jul. 29, 2014

(54) SILICON CARBIDE SINGLE CRYSTAL WAFER AND METHOD FOR MANUFACTURING THE SAME

(75) Inventors: Takayuki Maruyama, Kodaira (JP); Toshimi Chiba, Kodaira (JP)

(73) Assignee: Showa Denko K.K., Tokyo (JP)

( * ) Notice: Subject to any disclaimer, the term of this patent is extended or adjusted under 35 U.S.C. 154(b) by 2037 days.

(21) Appl. No.: 11/661,195

(22) PCT Filed: Aug. 24, 2005

(86) PCT No.: PCT/JP2005/015324  
§ 371 (c)(1),  
(2), (4) Date: Nov. 6, 2007

(87) PCT Pub. No.: WO2006/022282  
PCT Pub. Date: Mar. 2, 2006

(65) Prior Publication Data  
US 2008/0213536 A1    Sep. 4, 2008

(30) Foreign Application Priority Data

Aug. 24, 2004  (JP) ................ P2004-243913  
Nov. 22, 2004  (JP) ................ P2004-338063

(51) Int. Cl.  
*C30B 29/36*  (2006.01)

(52) U.S. Cl.  
USPC ................ 117/84; 117/90; 117/92; 117/93; 117/104; 117/105

(58) Field of Classification Search  
USPC ................ 117/84, 90, 92, 93, 104, 105  
See application file for complete search history.

(56) References Cited

U.S. PATENT DOCUMENTS

| | | |
|---|---|---|
| 4,912,064 A | 3/1990 | Kong et al. |
| 5,248,385 A | 9/1993 | Powell |
| 5,915,194 A | 6/1999 | Powell et al. |

FOREIGN PATENT DOCUMENTS

| | | |
|---|---|---|
| EP | 0 612 104 A2 | 8/1994 |
| EP | 1 619 276 A2 | 1/2006 |
| JP | 10-261615 A | 9/1998 |
| JP | 11-233391 A | 8/1999 |
| JP | 2004-002126 A | 1/2004 |
| JP | 2005-064383 A | 3/2005 |
| JP | 2005-277229 A | 10/2005 |
| WO | 00/79570 A2 | 12/2000 |
| WO | WO 03/078702 A1 | 9/2003 |

OTHER PUBLICATIONS

Supplementary European Search Report dated Apr. 9, 2010 (9 pages).  
Kojima, K., et al., "Homoepitaxial growth of 4H-SiC on-axis (0001) C-face substrates by chemical vapor deposition," Journal of Crystal Growth, Elsevier, Amsterdam, NL, vol. 269, No. 2-4, Sep. 1, 2004, pp. 367-376.  
Japanese Office Action (with translation) dated Apr. 6, 2010 (4 pages).

*Primary Examiner* — Bob M Kunemund  
(74) *Attorney, Agent, or Firm* — Sughrue Mion, PLLC

(57) ABSTRACT

The invention provides a method for manufacturing the silicon carbide single crystal wafer capable of improving the utilization ratio of the bulk silicon carbide single crystal, capable of improving characteristics of the element and capable of improving cleavability, and the silicon carbide single crystal wafer obtained by the manufacturing method. An α(hexagonal)-silicon carbide single crystal wafer which has a flat homoepitaxial growth surface with a surface roughness of 2 nm or less and which has an off-angle from the (0001)c plane of 0.4° or less.

6 Claims, 13 Drawing Sheets

200 μm

200 μm

200 μm

200 μm

200 μm

200 μm

200 μm

SILICON CARBIDE SINGLE CRYSTAL WAFER AND METHOD FOR MANUFACTURING THE SAME

TECHNICAL FIELD

The invention relates to a silicon carbide single crystal wafer particularly suitable for electronic devices and optical devices, and a method capable of efficiently manufacturing the silicon carbide single crystal wafer.

BACKGROUND ART

Silicon carbide has been noticed as materials of electronic devices such as small size and high output power semiconductors since silicon carbide has a larger band gap than silicon and is excellent in dielectric breakdown strength, heat resistance and radiation resistance, and as materials of optical devices since silicon carbide is excellent in joinability with other compound semiconductors excellent in optical characteristics. The silicon carbide single crystal is advantageous over the polycrystal of silicon carbide in that it is excellent in uniformity of intra-wafer characteristics when applied to devices such as wafers.

The wafer should be epitaxially grown as a thin film when luminescent devices and electronic devices are manufactured using the silicon carbide single crystal wafer. For example, silicon carbide is grown by a CVD method at a temperature range as high as from 1700 to 1800° C. or higher for epitaxially growing α-silicon carbide on (0001)c plane of α-silicon carbide single crystal. This is because planarity of the grown surface is remarkably impaired due to generation of triangular-pit defects when silicon carbide is grown at a temperature lower than 1700° C. However, exhaustion of members such as susceptors for holding the wafer is vigorous when silicon carbide is grown at a temperature range from 1700 to 1800° C. or higher, and electrical characteristics of the epitaxially grown film tend to be deteriorated due to impurities generated from the exhausted member.

Epitaxial growth without any dislocations is possible even at a temperature range from 1500 to 1600° C. by using a wafer having a so-called off-angle that is inclined several degrees to the (0001)c plane of the wafer. However, utilization rate of the bulk single crystal is remarkably decreased when the off-angle is large, and this problem is significant as the aperture size is larger. For example, when the wafer is manufactured by providing an off-angle of 3.5° that is common in silicon carbide wafer with crystal polymorph of 6H from a bulk single crystal grown in the [0001]c axis direction and having a crystal diameter of 50 mm and a crystal height of 20 mm, the utilization ratio of the bulk crystal is 84% and 16% of the crystal remains unused. The utilization ratio further decreases to 69% when the crystal diameter is expanded to 100 mm, and this decrease is not preferable since the price of the wafer increases. Since the dislocation density on the c-plane as a growth surface increases when the off-angle is large, characteristics of the element may be deteriorated. In addition, a large off-angle increases propagation of crystal defects of the substrate, especially surface dislocations, to an epitaxial growth layer, which increases a surface dislocation density in a grown crystal, thereby causing a problem of deterioration of characteristics of the element. In addition, when the off-angle is large, separation of the manufactured element by cleavage is difficult. This problem is crucial to optical devices, such as laser diodes, which utilize a cleavage surface itself.

While several technologies have been proposed as means for solving the above-mentioned problem, there is some room for improving the utilization rate of the bulk silicon carbide single crystal and for improving the characteristics of the element (for example, see Patent Document 1).

Patent Document 1: U.S. Pat. No. 4,912,064

DISCLOSURE OF THE INVENTION

Accordingly, there have been needs for a method for manufacturing a silicon carbide single crystal wafer that is able to improve the utilization rate of a bulk silicon carbide single crystal, to improve characteristics of the element and to improve cleavability, and a silicon carbide single crystal wafer obtained by the above-mentioned method.

Means for Solving the Problem

<1> An α(hexagonal)-silicon carbide single crystal wafer which has a flat homoepitaxial growth surface with a surface roughness of 2 nm or less and which has an off-angle from the (0001)c plane of 0.4° or less.

<2> The silicon carbide single crystal wafer according to <1>, wherein the surface roughness is 1.5 nm or less.

<3> The silicon carbide single crystal wafer according to <1> or <2>, wherein the off-angle is in the range from 0.1° to less than 0.4°.

<4> A method for manufacturing a silicon carbide single crystal wafer having: cutting a wafer from an α(hexagonal)-silicon carbide single crystal in an off-direction displaced by 2.5° or less from the <11-20> direction of the silicon carbide single crystal at an off-angle from the (0001)c plane of the silicon carbide single crystal of 0.4° or less; disposing the wafer in a reaction vessel; feeding a silicon source gas and carbon source gas in the reaction vessel; and reacting the silicon source gas and carbon source gas to epitaxially grow the α(hexagonal)silicon carbide single crystal on the wafer.

<5> The method for manufacturing the silicon carbide single crystal wafer according to <4>, wherein the off-angle of the wafer cut from the silicon carbide single crystal is in the range from 0.1 to 0.4°.

<6> The method for manufacturing the silicon carbide single crystal wafer according to <4> or <5>, wherein the surface of the wafer cut from the silicon carbide single crystal is subjected to a surface treatment before epitaxial growth so that the surface does not contain damages by machining.

<7> The method for manufacturing the silicon carbide single crystal wafer according to any one of <4> to <6>, wherein the feed ratio (C/Si) of the carbon source gas (C) to the silicon source gas (Si) is 1.5 or less.

<8> The method for manufacturing a silicon carbide single crystal wafer according to any one of <4> to <7> by reacting the carbon source gas and silicon source gas at a temperature range from 1550 to 1700° C.

<9> The method for manufacturing a silicon carbide single crystal wafer according to any one of <4> to <8>, wherein the off-angle is increased from 0° in an approximately fan-like manner from one end portion to the other end portion of the wafer to restrict a region with an off-angle of less than 0.1° to a range around the one end portion of the wafer.

<10> A silicon carbide single crystal wafer obtained by a manufacturing method having: cutting a wafer from an α(hexagonal)-silicon carbide single crystal in an off-direction displaced by 2.5° or less from the <11-20> direction of the silicon carbide single crystal at an off-angle from the (0001)c plane of the silicon carbide single crystal of 0.4° or less; disposing the wafer in a reaction vessel; feeding a silicon source gas and carbon source gas in the reaction vessel; and reacting the silicon source gas and carbon source gas to epitaxially grow the α(hexagonal)silicon carbide single crystal on the wafer.

<11> The silicon carbide single crystal wafer according to <10>, wherein the off-angle of the wafer cut from the silicon carbide single crystal is in the range from 0.1° to 0.4°.

<12> The silicon carbide single crystal wafer according to <10> or <11>, wherein the surface of the wafer cut from the silicon carbide single crystal is subjected to a surface treatment before epitaxial growth so that the surface does not contain damages by machining.

<13> The silicon carbide single crystal wafer according to any one of <10> to <12>, wherein the feed ratio (C/Si) of the carbon source gas (C) to the silicon source gas (Si) is less than 1.5.

<14> The silicon carbide single crystal wafer according to any one of <10> to <13>, wherein the carbon source gas and silicon source gas are reacted at a temperature range from 1550 to 1700° C.

<15> The silicon carbide single crystal wafer according to any one of <10> to <14>, wherein the off-angle is increased from 0° in an approximately fan-like manner from one end portion to the other end portion of the wafer to restrict a region with an off-angle of less than 0.1° to a range around the one end portion of the wafer.

BEST MODE FOR CARRYING OUT THE INVENTION

The invention will be described below with reference to examples. However, the invention is by no means restricted to these examples.

Figure 1:
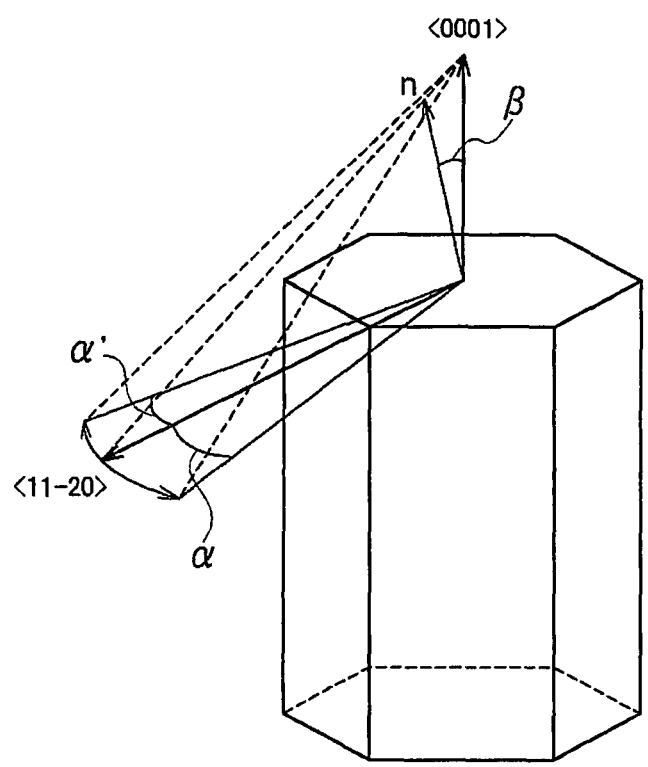
FIG. 1 shows a schematic diagram showing the off-angle and off-direction of a hexagonal-silicon carbide single crystal.

In this specification, the term "off-direction" refers to a direction in which the normal to the wafer surface shown by "n" in FIG. 1 is inclined from the <0001> direction, and is represented as an direction of a vector obtained by projecting n onto the (0001)c plane. In FIG. 1, the off-direction of n corresponds with the <11-20> direction. FIG. 1 also shows a case where the off-direction is displaced by $\alpha°$ or $\alpha'°$ from the <11-20> direction. The term "off-angle" refers to an angle of inclination of n from the <0001> direction, and is shown by "$\beta$" in FIG. 1.

An embodiment for manufacturing the silicon carbide single crystal will be described below.

(a) A bulk of an α(hexagonal)-silicon carbide single crystal is prepared at first.

(b) A wafer is cut from the prepared silicon carbide single crystal in an off-direction displaced by 2.5° or less from the <11-20> direction at an off-angle from the (0001)c plane of 0.1° to 0.4°. When the off-direction is displaced by more than 2.5° from the <11-20> direction, linear bumps appear on an epitaxial growth surface. When the off-angle is less than 0.1°, a plurality of concave and convex portions with a height of 2 nm or more appear on an epitaxial growth surface of silicon carbide, and therefore it becomes difficult to manufacture good elements. On the other hand, when the off-angle exceeds 0.4°, decrease in the utilization rate of the bulk crystal and deterioration of characteristics of elements cannot be ignored. Machining damages are removed from the surface of the wafer by applying surface treatment to the cut wafer in order to prevent defects derived from the defects of the substrate from generating. Examples of the surface treatment method include chemical mechanical polishing (CMP) and hydrogen etching.

(c) Then, the wafer is disposed in a chemical vapor deposition (CVD) apparatus. An example of the chemical vapor deposition method is a horizontal or vertical hot-wall CVD apparatus.

(d) After heating the inside of the reaction vessel at a reaction temperature, a silicon source gas and a carbon source gas are supplied. While examples of the silicon source gas include monosilane, monochlorosilane, dichlorosilane and trichloroilane, monosilane is preferably used from the viewpoint of high reactivity and no generation of corrosive byproducts. While examples of the carbon source gas include acetylene, ethylene, ethane and propane, propane gas is preferably used in terms of high efficiency as the carbon source. Hydrogen ($H_2$) is preferable as a carrier gas. The feed ratio (C/Si) of carbon (C) in the carbon source gas and silicon (Si) in the silicon source gas is preferably in the range from 0.5 to 1.4. Silicon is precipitated in the gas phase when the ratio C/Si is less than 0.5 to make it difficult to attain good epitaxial growth, while defects from slight crystal defects to visible macro-triangular pit defects are readily generated when the ratio exceeds 1.4. It is also possible to allow the crystal to grow at the above-mentioned C/Si ratio at the initial stage of growth, followed by succeeding growth under a condition having a different C/Si ratio from the above-mentioned ratio to form a different layer. It is favorable to etch the surface of the substrate at an intermediate stage of increasing or decreasing the temperature, or to introduce an appropriate gas in order to suppress etching. A gas containing an appropriate amount of impurities may be introduced during the growth for obtaining desired electric characteristics.

(e) The silicon carbide single crystal is epitaxially grown on the wafer by reacting the silicon source gas with the carbon source gas. For example, it is preferable to flow the hydrogen gas while the wafer is rotating, and to increase the temperature while the pressure is kept at 0 to 200 mbar. An appropriate amount of propane gas is introduced when the temperature has exceeded the range from 1300 to 1400° C. in order to suppress the substrate form being etched. Then, the temperature is increased to 1550 to 1700° C., and an appropriate amount of silane gas and propane gas with the above-mentioned C/Si ratio is introduced under an appropriate reduced pressure for the desired growth rate while the above-mentioned temperature is maintained.

The silicon carbide single crystal is manufactured as described above. In the epitaxial growth of the silicon carbide single crystal using a substrate perpendicular to the [0001]c axis, epitaxial growth using the silicon surface is usually able to readily control the amount of impurities in wider range than epitaxial growth on the carbon surface. Consequently, the epitaxially grown film on the silicon surface can control electric characteristics in a wider range than the epitaxially grown film on the carbon surface. On the other hand, bunching of surface steps is usually liable to occur on the silicon surface than on the carbon surface. In other words, obtaining a flat epitaxial growth surface on the silicon surface is generally considered to be difficult than on the carbon surface. However, a quite flat epitaxial growth surface can be obtained either on the silicon surface or on the carbon surface by the manufacturing method according to the embodiment of the invention.

A quite flat epitaxial growth surface can be also obtained even when a wafer having a large aperture, for example a silicon carbide single crystal wafer with a diameter of 50 mm or more, is produced by the manufacturing method according to the embodiment of the invention. Thus, a silicon carbide single crystal wafer having a diameter of 50 mm or more can be provided.

Modification of the Embodiment

From the viewpoint of improving the utilization rate of the bulk crystal and reducing propagation of defects of the substrate, it is desirable to cut a wafer from the silicon carbide single crystal so that the off-angle is as small as possible, 0.1° to 0.4°. When the off-angle is distributed in the surface of the wafer, it is desirable to cut a wafer from the silicon carbide single crystal so that the off-angle is 0.1° or more in 80% or more of the total area of the wafer cut from the silicon carbide single crystal. More specifically, when a constant off-angle is difficult to obtain over the entire surface of the wafer, it is favorable to increase the off-angle from 0° in an approximately fan-like manner from one end portion to the other end portion of the wafer in order to restrict a region with an off-angle of less than 0.1° to a narrow range (that is, to a range having an area of 20% or less of the total area) around the one end portion of the wafer. By distributing an off-angle of 0.1° or more in an approximately fan-like manner over substantially the entire surface of the wafer according to the method of the embodiment of the invention, it is possible to suppress the influence of distribution of the off-angle, usually found in the surface of the wafer, and the off-direction, thereby enabling a quite flat epitaxial growth surface without any macroscopic convex and concave portions to be always obtained over the entire surface of the wafer.

(Wafer of Silicon Carbide Single Crystal)

The silicon carbide single crystal wafer is manufactured by the method for manufacturing a silicon carbide single crystal according to the above-mentioned embodiment. More specifically, according to the above-mentioned embodiment, it is possible to obtain an α(hexagonal)-silicon carbide single crystal wafer having a flat homoepitaxial growth surface with a surface roughness of 2 nm or less and by having an off-angle from the (0001)c plane of 0.4° or less. When the surface of the silicon carbide single crystal wafer is observed with a Nomarski (differential-interference) optical microscope, surface defects such as immigration of macroscopic triangular pits and polymorphs, which have been previously reported, are not found at all in spite of quite small off-angles. Further, when the surface of the silicon carbide single crystal wafer is observed with an atomic force microscope (AFM), a region whose off-direction is displaced by 2.5° or less from the <11-20> direction and whose off-angle from the (0001)c plane is in the range from 0.1° to 0.4° is quite flat without any concave and convex portions with a height exceeding 2 nm (that is, the surface roughness is 2 nm or less). In addition, linear or spot-like macroscopic concave and convex portions of more than micrometer-order, which are generated when the off-direction is displaced by more than 2.5° from the <11-20> direction, are not observed at all either. In addition, the number of surface dislocations which originate from the substrate and propagate to an epitaxial growth crystal is quite small, 10 dislocations/cm$^2$ or less. Accordingly, a high quality element can be manufactured. The surface roughness is usually estimated to be small by being averaged when the detection region or measuring spot diameter is large as in the optical measurement. On the contrary, the maximum surface roughness (maximum height: Ry) is usually reduced when the measuring region is small. Accordingly, in this specification, the "surface roughness" is defined to be Ry determined in a measuring region of at least 5 μm square by AFM, and the surface with sufficiently small Ry and without any macroscopic concave and convex portions is defined as a flat surface.

The electronic device using the silicon carbide single crystal wafer is expected to be a metal oxide semiconductor (MOS) field effect transistor. A gate oxidation film (insulation film) of an MOS structure is usually formed on the surface of the epitaxially grown film by thermal oxidation of the epitaxially grown film. Accordingly, it is preferable that the surface of the epitaxially grown film before oxidation is sufficiently flat as compared with the order of the thickness of the oxidation film in order to form an oxidation film with a uniform thickness and uniform pressure resistance. Since the gate oxidation film usually has a thickness in the range from 20 to 60 nm, the surface roughness of the epitaxially grown film is required to be in the range from about 2 nm to about 6 nm assuming that the acceptable range of variation of the thickness of the oxidation film is 10%. However, the surface roughness of the silicon carbide single crystal according to the invention never exceeds 2 nm as described above. Therefore, the silicon carbide single crystal according to the invention may be favorably used for electronic devices, particularly for manufacturing the MOS field effect transistors.

(Applications)

The silicon carbide single crystal wafer according to the invention is of quite high quality without immigration of macroscopic triangular pits and polymorphs, with a flat surface and with fewer surface dislocations on the substrate. Accordingly, the wafer may be favorably used for electronic devices, particularly power devices and luminescent diode, being excellent in high voltage resistance, dielectric breakdown strength, heat resistance and radiation resistance.

EXAMPLES

While the invention is described in detail with reference to examples and comparative examples, the invention is by no means restricted to these examples.

Example 1

Wafer: A wafer of 6H polymorph (diameter: 50.8 mm) whose off-angle was 0.2° over the entire substrate and whose off-direction was displaced by 0.5° from the <11-20> direction was prepared, and the silicon surface of the wafer prepared was etched by heating at 1400° C. in hydrogen for 30 minutes.

Growth Condition: The wafer was disposed in a hot-wall CVD apparatus. Hydrogen was fed at a flow rate of 70 slm while the wafer was rotating, and the temperature was raised while the pressure was maintained at 120 mbar. Propane gas was introduced at a rate of 8 sccm when the temperature had exceeded 1400° C. The temperature was further raised to 1650° C., and the crystal was epitaxially grown for 1.5 hours by introducing monosilane gas at a rate of 20 sccm while the temperature was maintained at 1650° C. The feed ratio (C/Si) of the material gas was 1.2.

Figure 2:
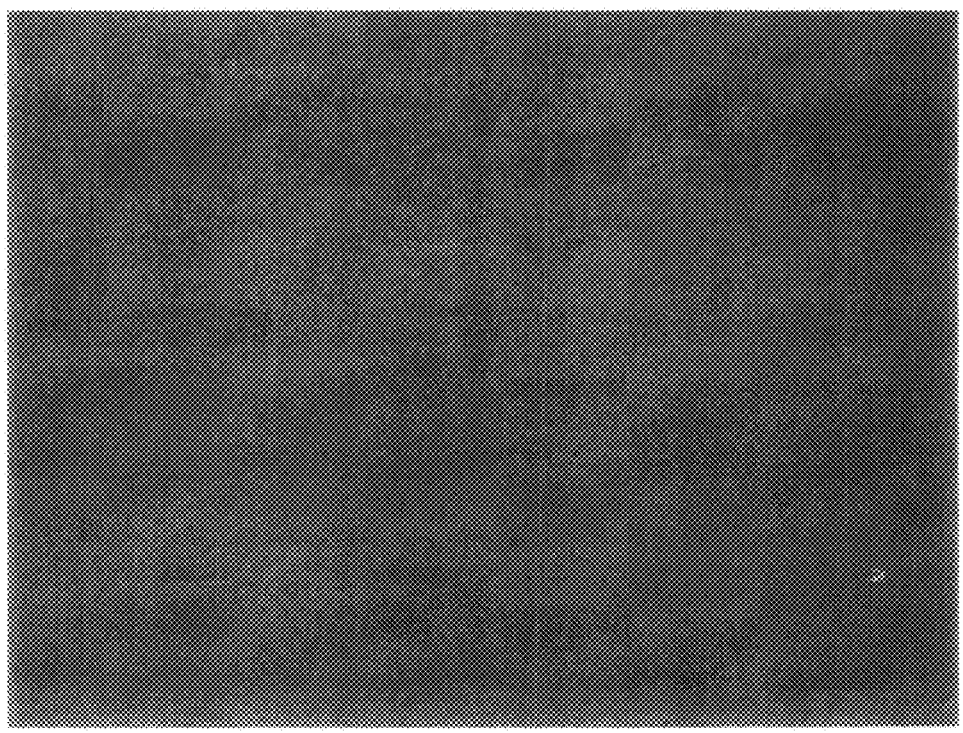
FIG. 2 shows a differential interference microscope image of the surface of a silicon carbide single crystal wafer according to Example 1.

Results: As shown in FIG. 2, an epitaxial film having a quite flat surface without any linear bumps was obtained on the entire surface of the wafer. The film thickness of the epitaxial layer was 7.1 μm.

The results of measurement of the surface roughness with an atomic force microscope showed that the maximum height (Ry) was 1.460 nm in a 5 μm square area.

Examples 2 and 3 and Comparative Examples 1 to 3

Figure 3:
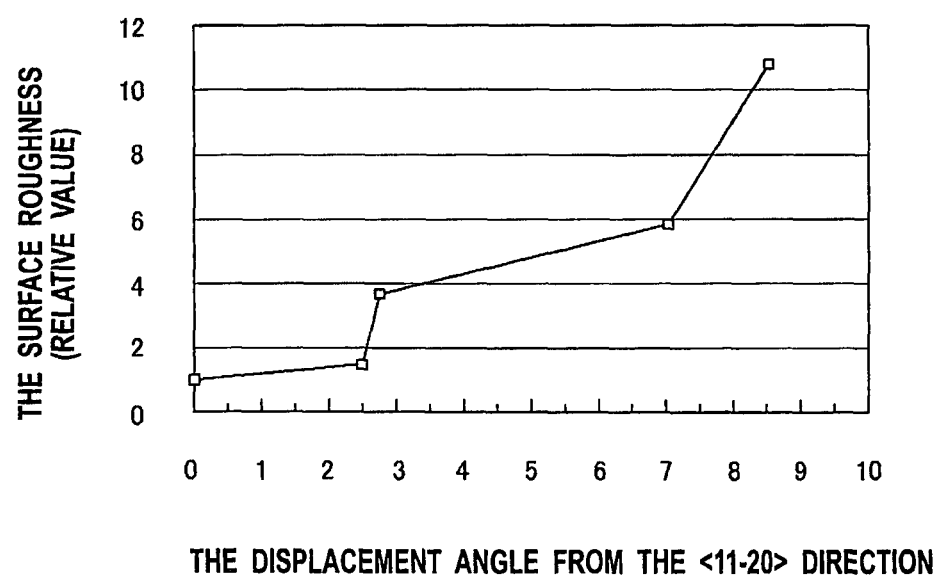
FIG. 3 shows a graph showing the relation between the off-direction and surface roughness of wafers according to Examples 2 and 3 and Comparative Examples 1 to 3.

The experiments were performed by the same method as in Example 1, except that wafers of 6H polymorph whose off-directions were displaced from the <11-20> direction by 0.0° (Example 2), 2.5° (Example 3), 2.8° (Comparative Example 1), 7.1° (Comparative Example 2), and 8.6° (Comparative Example 3) were used. The relation between the off-direction and surface roughness of the wafers is shown in FIG. 3.

Figure 4:
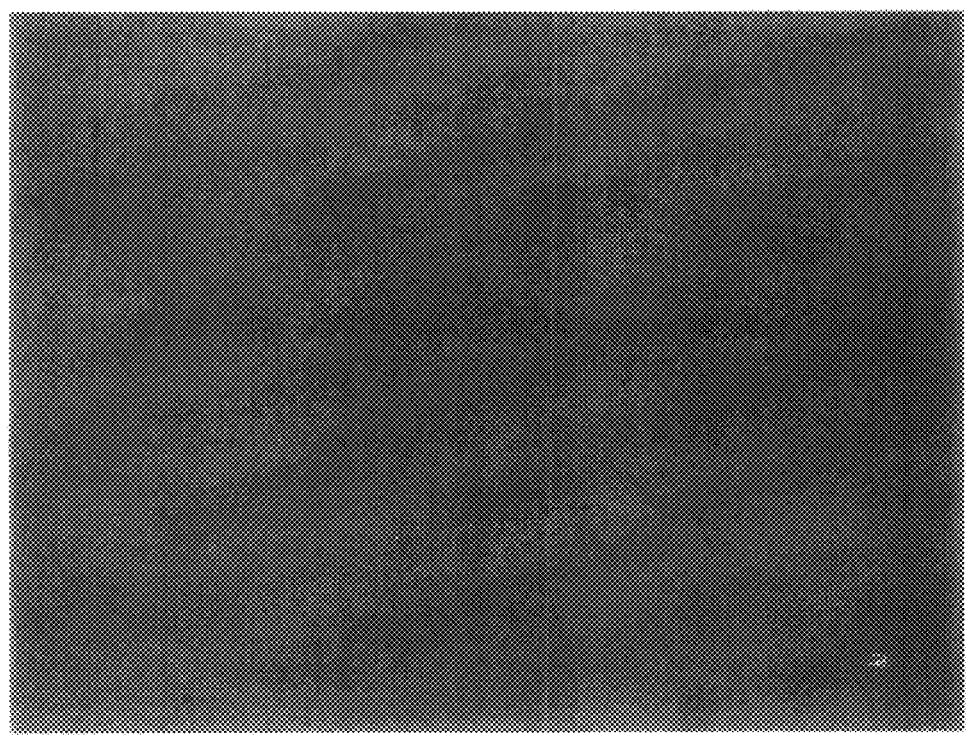
FIG. 4 shows a differential interference microscope image of the surface of the wafer of a silicon carbide single crystal according to Example 3.
Figure 4:
Figure 5:
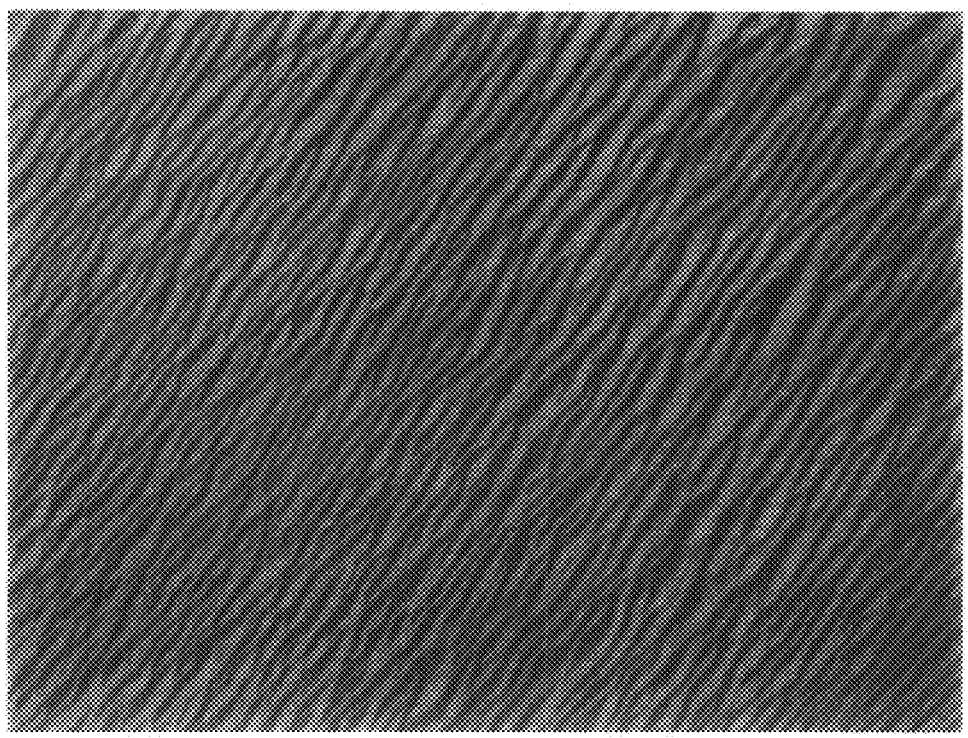
FIG. 5 shows a differential interference microscope image of the surface of the wafer of a silicon carbide single crystal according to Comparative Example 1.
Figure 5:

Results: When the off-direction was displaced from the <11-20> direction by 2.5° or less, linear bumps were not generated as shown in FIG. 4. On the other hand, when the off-direction was displaced from the <11-20> direction by more than 2.5°, linear bumps with a height of 5 to 10 nm and a width of 10 to 40 μm were generated on substantially the entire surface of the wafer as shown in FIG. 5 so that a rough epitaxial film having macroscopic concave and convex portions on the surface thereof was obtained. These results indicate that even when the off-angle is small, a silicon carbide single crystal having a quite flat surface without any linear bumps can be obtained by setting the angle of displacement of the off-direction from the <11-20> to 2.5° or less.

Example 4

Carbon Surface

Wafer: A wafer of 6H polymorph (diameter: 50.8 mm) whose off-angle was 0.2° over the entire substrate and whose off-direction was displaced by 0.5° from the <11-20> direction was prepared, and after mirror polishing of the carbon surface of the wafer prepared, an oxide film formed on the surface by heating the wafer at 1100° C. in oxygen for 5 hours was removed by treating with hydrofluoric acid. The wafer was used after polishing the surface by CMP for 8 hours using silica colloid.

Growth condition: The wafer was disposed in a hot-wall CVD apparatus. Hydrogen was fed at a flow rate of 70 slm while the wafer was rotating, and the temperature was raised while the pressure was maintained at 120 mbar. Propane gas was introduced at a rate of 8 sccm when the temperature had exceeded 1400° C. The temperature was further raised to 1650° C., and the crystal was epitaxially grown for 1.5 hours by introducing monosilane gas at a rate of 20 sccm while the temperature was maintained at 1650° C. The feed ratio (C/Si) of the material gas was 1.2.

Figure 6:
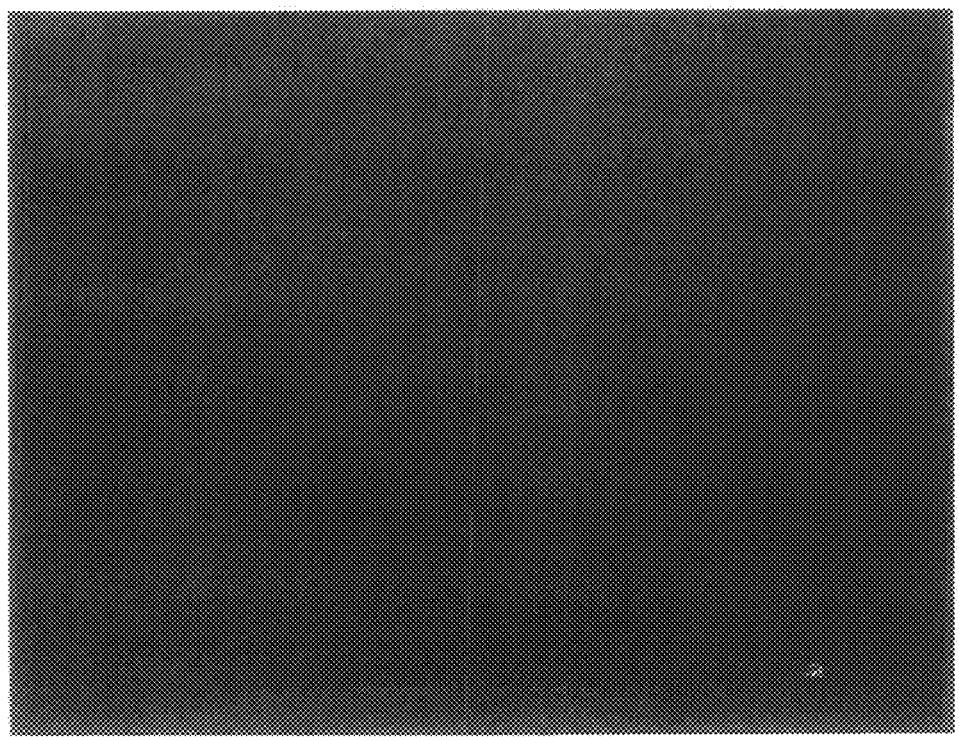
FIG. 6 shows a differential interference microscope image of the surface of a silicon carbide single crystal wafer according to Example 4.

Results: As shown in FIG. 6, an epitaxial film having a quite flat surface without any linear bumps was obtained on the entire surface of the wafer. The film thickness of the epitaxial layer was 3.7 μm.

The results of measurement of the surface roughness with an atomic force microscope showed that the maximum height (Ry) was 0.812 nm in a 5 μm square area.

Examples 5 and 6 and Comparative Examples 4 and 5

Figure 7:
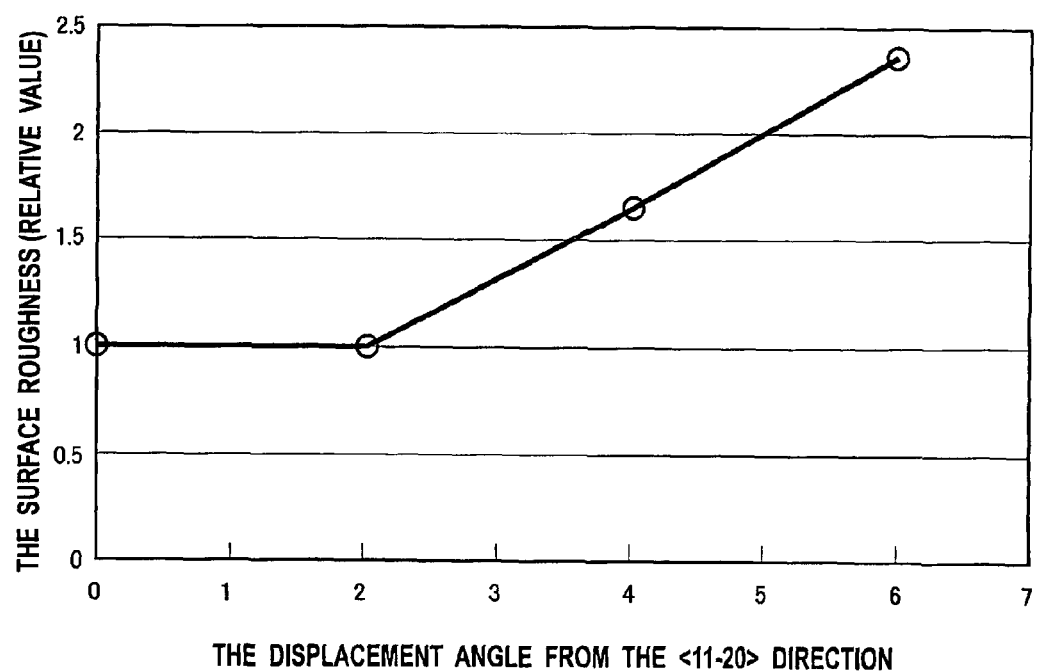
FIG. 7 shows a graph showing the relation between the displacement of the off-direction from <11-20> and surface roughness of wafers according to Examples 5 and 6 and Comparative Examples 4 and 5.

The experiments were performed by the same method as in Example 4, except that wafers of 6H polymorph whose off-directions were displaced from the <11-20> direction by 0.0° (Example 5), 2.0° (Example 6), 4.0° (Comparative Example 4), and 6.0° (Comparative Example 5) were used. The relation between the displacement of the off-direction from the <11-20> and surface roughness of the wafers is shown in FIG. 7.

Figure 8:
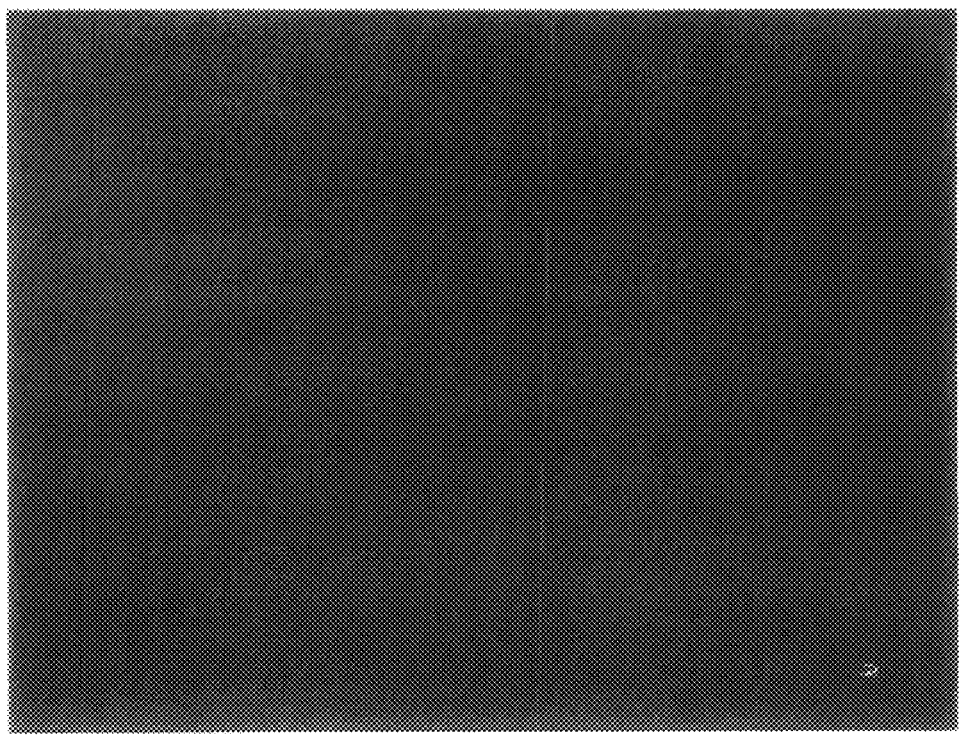
FIG. 8 shows a differential interference microscope image of the surface of a silicon carbide single crystal wafer according to Example 6.
Figure 9:
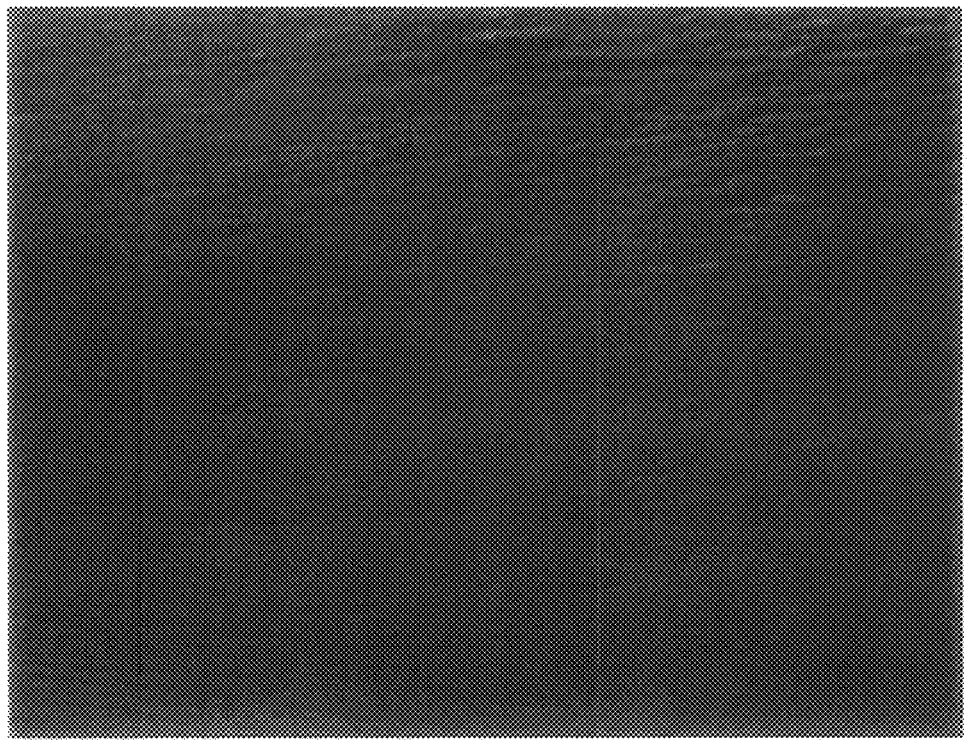
FIG. 9 shows a differential interference microscope image of the surface of the silicon carbide single crystal wafer according to Comparative Example 4.
Figure 9:

Results: When the off-direction was displaced from the <11-20> direction by 2.5° or less, linear bumps were not generated as shown in FIG. 8. On the other hand, when the off-direction was displaced from the <11-20> direction by more than 2.5°, linear bumps with a height of 4 to 8 nm and a width of 10 to 30 μm were generated on substantially the entire surface of the wafer as shown in FIG. 9 so that a rough epitaxial film having macroscopic concave and convex portions on the surface thereof was obtained. These results indicate that even when the off-angle is small, a silicon carbide single crystal having a quite flat surface without any linear bumps can be obtained by setting the angle of displacement of the off-direction from the <11-20> to 2.5° or less.

Example 7

Wafer: A wafer of 4H polymorph (diameter: 50.8 mm) whose off-angle was 0.2° over the entire substrate and whose off-direction was displaced by 0.5° from the <11-20> direction was prepared, and after mirror polishing of the carbon surface of the wafer prepared, an oxide film formed on the surface by heating the wafer at 1100° C. in oxygen was removed by treating with hydrofluoric acid. The wafer was used after polishing the surface by CMP for 8 hours using silica colloid.

Growth condition: The wafer was disposed in a hot-wall CVD apparatus. Hydrogen was fed at a flow rate of 70 slm while the wafer was rotating, and the temperature was raised while the pressure was maintained at 120 mbar. Propane gas was introduced at a rate of 8 sccm when the temperature had exceeded 1400° C. The temperature was further raised to 1650° C., and the crystal was epitaxially grown for 1.5 hours by introducing monosilane gas at a rate of 20 sccm while the temperature was maintained at 1650° C. The feed ratio (C/Si) of the material gas was 1.2.

Figure 10:
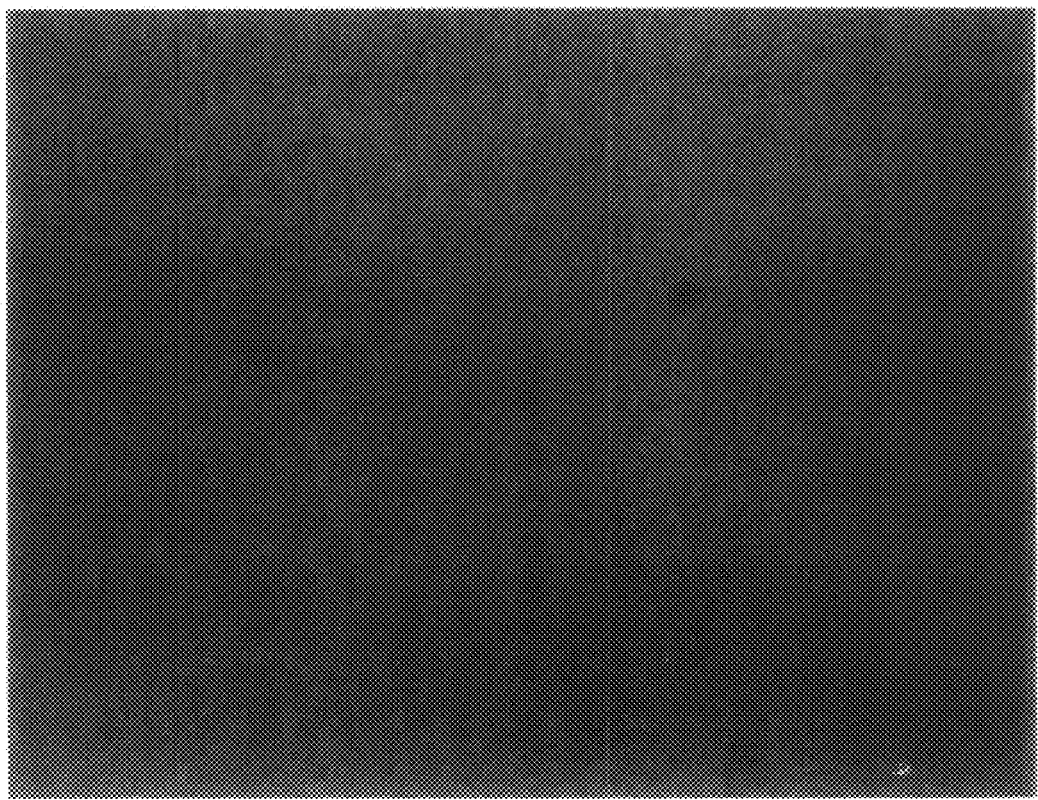
FIG. 10 shows a differential interference microscope image of the surface of a silicon carbide single crystal wafer according to Example 7.

Results: As shown in FIG. 10, an epitaxial film having a quite flat surface without any linear bumps was obtained on the entire surface of the wafer. The film thickness of the epitaxial layer was 2.8 μm.

The results of measurement of the surface roughness with an atomic force microscope showed that the maximum height (Ry) was 1.47 nm in a 5 μm square area.

Examples 8 and 9 and Comparative Examples 6 and 7

Figure 11:
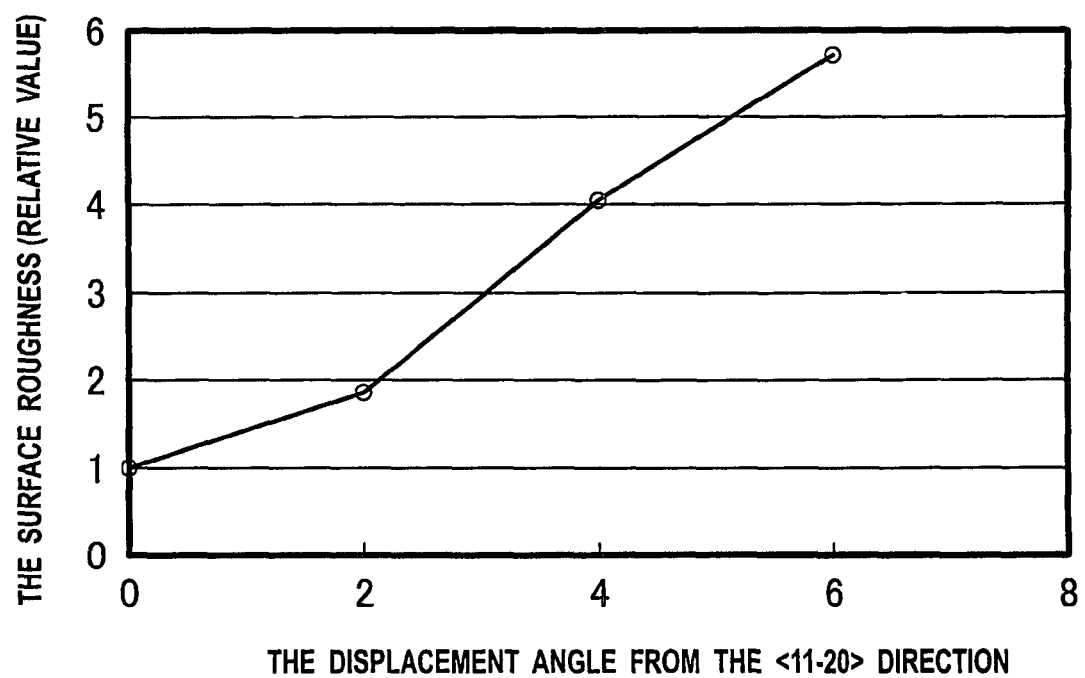
FIG. 11 shows a graph showing the relation between the displacement of the off-direction from <11-20> and surface roughness of wafers according to Examples 8 and 9 and Comparative Examples 6 and 7.

The experiments were performed by the same method as in Example 7, except that wafers of 4H polymorph whose off-directions were displaced from the <11-20> direction by 0.0° (Example 8), 2.0° (Example 9), 4.0° (Comparative Example 6), and 6.0° (Comparative Example 7) were used. The relation between the displacement of the off-direction from the <11-20> and surface roughness of the wafers is shown in FIG. 11.

Figure 12:
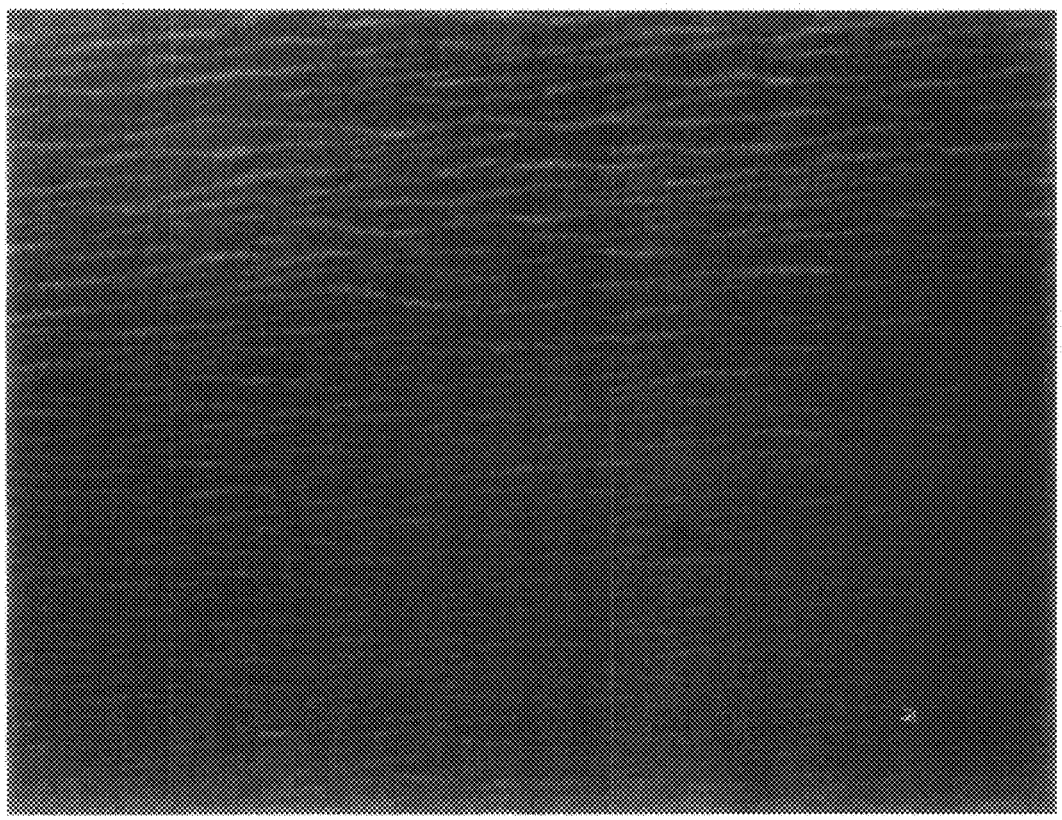
FIG. 12 shows a differential interference microscope image of the surface of the silicon carbide single crystal wafer according to Example 9.
Figure 13:
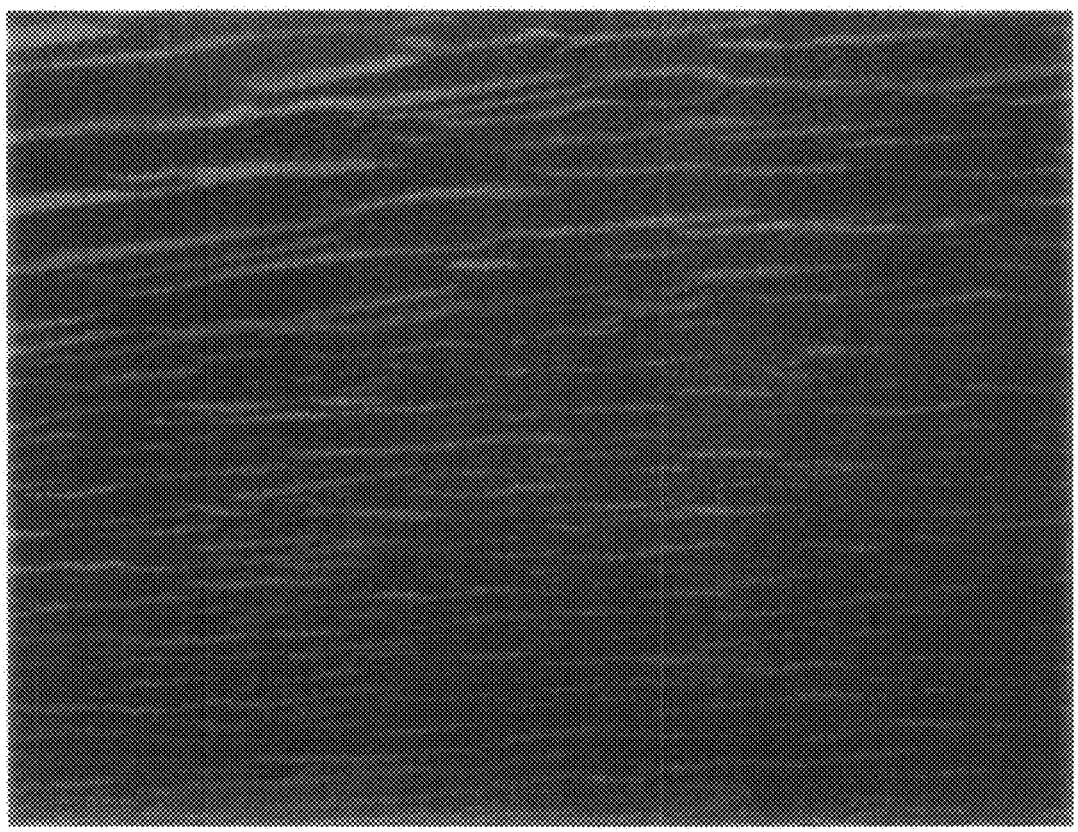
FIG. 13 shows a differential interference microscope image of the surface of the silicon carbide single crystal wafer according to Comparative Example 6.

Results: When the off-direction was displaced from the <11-20> direction by 2.5° or less, linear bumps were not generated as shown in FIG. 12. On the other hand, when the off-direction was displaced from the <11-20> direction by more than 2.5°, linear bumps with a height of 4 to 8 nm and a width of 10 to 30 μm were generated on substantially the entire surface of the wafer as shown in FIG. 13 so that a rough epitaxial film having macroscopic concave and convex portions on the surface thereof was obtained. These results indicate that even when the off-angle is small, a silicon carbide single crystal having a quite flat surface without any linear bumps can be obtained by setting the angle of displacement of the off-direction from the <11-20> to 2.5° or less.

The application of this invention pertains claim of priority based on the prior Japanese patent applications filed by the present applicant, or Japanese Patent Application Nos. 2004-243913 (application date: Aug. 24, 2004) and 2004-338063 (application date: Nov. 22, 2004), and these specifications are incorporated herein by reference.

INDUSTRIAL APPLICABILITY

The invention provides a method for manufacturing the silicon carbide single crystal wafer capable of improving the utilization ratio of the bulk silicon carbide single crystal, capable of improving characteristics of the element and capable of improving cleavability, and the silicon carbide single crystal wafer obtained by the manufacturing method.

What we claims:

1. A method for manufacturing a silicon carbide single crystal wafer comprising:
    cutting a wafer from an α(hexagonal)-silicon carbide single crystal in an off-direction displaced by 2.5° or less from the <11-20> direction of the silicon carbide single crystal at an off-angle from the (0001)c plane of the silicon carbide single crystal of 0.4° or less;
    disposing the wafer in a reaction vessel;
    feeding a silicon source gas and carbon source gas in the reaction vessel; and
    reacting the silicon source gas and carbon source gas to epitaxially grow the α(hexagonal) silicon carbide single crystal on the wafer.

2. The method for manufacturing the silicon carbide single crystal wafer according to claim 1, wherein the off-angle of the wafer cut from the silicon carbide single crystal is in the range from 0.1 to 0.4°.

3. The method for manufacturing the silicon carbide single crystal wafer according to claim 1, wherein the surface of the wafer cut from the silicon carbide single crystal is subjected to a surface treatment before epitaxial growth so that the surface does not contain damages by machining.

4. The method for manufacturing the silicon carbide single crystal wafer according to claim 1, wherein the feed ratio (C/Si) of the carbon source gas (C) to the silicon source gas (Si) is 1.5 or less.

5. The method for manufacturing a silicon carbide single crystal wafer according to claim 1 by reacting the carbon source gas and silicon source gas at a temperature range from 1550 to 1700° C.

6. The method for manufacturing a silicon carbide single crystal wafer according to claim 1, wherein the off-angle is increased from 0° in an approximately fan-like manner from one end portion to the other end portion of the wafer to restrict a region with an off-angle of less than 0.1° to a range around the one end portion of the wafer.

* * * * *